United States Patent [19]
Shim et al.

[11] Patent Number: 5,614,436
[45] Date of Patent: Mar. 25, 1997

[54] MULTIPLE QUANTUM WELL DISTRIBUTED FEEDBACK SEMICONDUCTOR LASER DEVICE AND METHOD FOR FABRICATING THE SAME

[75] Inventors: Jong-In Shim; Mitsuhiro Kitamura, both of Tokyo, Japan

[73] Assignee: NEC Corporation, Tokyo, Japan

[21] Appl. No.: 400,568

[22] Filed: Mar. 8, 1995

Related U.S. Application Data

[62] Division of Ser. No. 171,415, Dec. 22, 1993, Pat. No. 5,450,437.

[30] Foreign Application Priority Data

Dec. 22, 1992 [JP] Japan .................... 4-341745

[51] Int. Cl.⁶ ...................................... H01S 3/08
[52] U.S. Cl. .................... 437/129; 437/89; 148/DIG. 95
[58] Field of Search ............. 437/129, 89; 148/DIG. 95

[56] References Cited

U.S. PATENT DOCUMENTS

| | | | |
|---|---|---|---|
| 4,114,257 | 9/1978 | Bellavance | 437/129 |
| 5,250,462 | 10/1993 | Sasaki et al. | 437/89 |
| 5,321,716 | 6/1994 | Kinoshita et al. | |
| 5,358,896 | 11/1994 | Komatsu et al. | 437/129 |
| 5,432,123 | 7/1995 | Dentai et al. | 437/129 |
| 5,436,195 | 7/1995 | Kimura et al. | 437/129 |

FOREIGN PATENT DOCUMENTS

| | | |
|---|---|---|
| 93692 | 5/1986 | Japan . |
| 166281 | 7/1988 | Japan . |
| 82909 | 4/1993 | Japan . |
| 327112 | 12/1993 | Japan . |
| 327111 | 12/1993 | Japan . |
| 2128023 | 4/1984 | United Kingdom . |

OTHER PUBLICATIONS

Kuznetsov et al., M., "Frequency Modulation Response of Tunable Two–Segment Distributed Feedback Lasers", *Appl. Phys. Lett.*, Oct. 30, 1989, vol. 55, No. 18, pp. 1826–1828.

Okai et al., M., "Ultra–Narrow Spectral Linewidth (56 kHz) Corrugation–Pitch–Modulated Multi–Quantum–Well Distributed Feedback Lasers", *Conference on Laser and Electro-Optics*, CLEO '91, pp. 654–655.

Ogita et al., S., "FM Response of Narrow–Linewidth, Multi–electrode λ/4 Shift DFB Laser", *IEEE Photonics Technology Letters*, Mar. 1990, vol. 2, No. 3, pp. 165–166.

Lau, K., "Frequency Modulation and Linewidth of Gain–Levered Two–Section Single Quantum Well Lasers", *Appl. Phys. Lett.*, Nov. 12, 1990, vol. 57, No. 20, pp. 2068–2070.

Kitamura et al., M., "High–Performance 1.5 μm Multiple–Quantum–Well DFB–DC–PBH–LD's at 30 mW Output Power for Gb/s Range Coherent Systems", *IEEE Photonics Technology Letters*, Apr. 1991, vol. 3, No. 4, pp. 305–307.

Okai, M., "Tunable DFB Lasers with Ultra–Narrow Spectral Linewidth", *Fourth Optoelectronics Conference (OEC. '92) Technical Digest*, Jul. 1992, pp. 58–59.

(List continued on next page.)

*Primary Examiner*—Robert Kunemund
*Attorney, Agent, or Firm*—Young & Thompson

[57] ABSTRACT

A distributed feedback semiconductor laser device having a semiconductor substrate, a bottom electrode formed on a bottom surface of the substrate, a corrugation-shaped grating formed on a top surface of the substrate, an active waveguide layer whose energy band gap profile and whose light propagation constant are varied along cavity length direction of the laser device, the active waveguide layer being formed over the corrugation-shaped grating, a clad layer formed to cover the active waveguide layer, and a top electrode formed on a top of the clad layer. The active waveguide layer is grown by a selective metal organic vapor phase epitaxy with use of slender insulation masks having a variation in width, the slender insulation masks being arranged at both sides of an area on which the active waveguide layer is grown.

10 Claims, 5 Drawing Sheets

OTHER PUBLICATIONS

T. Kato et al., "DFB–LD/Modulator Integrated Light Source by Bandgap Energy Controlled Selective MOVPE," Electronics Letters, vol. 28, pp. 153–154, 1 Jan. 1992.

T. Sasaki et al., "Monolithically integrated multi-wavelength MQW–DBR laser diodes fabricated by selective metalorganic vapor phase epitaxy," Journal of Crystal Growth 145 (1994) pp. 846–851.

MULTIPLE QUANTUM WELL DISTRIBUTED FEEDBACK SEMICONDUCTOR LASER DEVICE AND METHOD FOR FABRICATING THE SAME

This application is a division of application Ser. No. 08/171,415, filed Dec. 22, 1993, now U.S. Pat. No. 5,450,437.

BACKGROUND OF THE INVENTION

1. Field of the Invention

The invention relates to a multiple quantum well distributed feedback (DFB) semiconductor laser device suitable for a coherent optical transmission system and a method for fabricating the same.

2. Description of the Related Art

The coherent optical communication system is more attractive than a direct detecting system as showing a high receiving sensitivity which is suitable for a long distance optical transmission. The most realizable variety of the coherent optical transmission system seems to be a frequency shift keying (FSK) coherent optical transmission as it has a simple transmitter structure system in which a direct modulation is conducted for the semiconductor frequency.

The laser device as an optical transmitter used for the optical coherent transmission is required to show a single mode oscillation or a stability of the single wavelength oscillation at high output. The laser device for the optical coherent transmission is further required to show a high efficiency of a frequency modulation (FM) and a uniform or flat frequency modulation response in a wide modulation frequency range as well as a narrow spectral line width. The distributed feedback laser is useful as the suitable laser device for the optical coherent transmission. The distributed feedback semiconductor laser device has a waveguide and a corrugation-shaped grating formed over or under the waveguide to accomplish feedback of optical wave. An oscillation wavelength of a laser beam is defined by almost only a pitch or a period of the corrugation shaped grating thereby the stable single mode oscillation is obtained. Actually, however, two resonant vertical modes exist at opposite sides of the wavelength defined by the corrugation-shaped grating. There is a problem with simultaneous appearances of oscillations in the two resonant vertical modes. There is a further problem with a variation of the wavelength in a high optical output.

To solve the above problems, it is necessary to cause a resonance at the center of the Bragg wavelengths. For that purpose, it has been known to provide a $\lambda/4$ shift at the center of the corrugation shaped grating. The $\lambda/4$ shift causes a phase shift of $\pi$. The distributed feedback laser with the $\lambda/4$ shift has properties of a narrow spectral linewidth of less than 1 MHz, an optical output of more than 30 mW and a frequency modulation efficiency of approximately 200 MHz/mA. One of such the distributed feedback laser with the $\lambda/4$ shift is disclosed in 1991 IEEE Photonics Technology Letters vol. 3, No.4, pp. 305–307.

Such distributed feedback laser with a $\lambda/4$ shift, however, has a disadvantage because it is difficult to fabricate the phase shift grating, although the phase shift grating may be fabricated by use of either multilayer photoresist mask or electron beam and the like. The distributed feedback laser with the $\lambda/4$ shift has further problems as described below. A distribution of the optical intensity tends to be concentrated around the phase shift grating. As the optical output is increased, a carrier density around the phase shift grating is reduced as compared to the peripheral portion of the phase shift grating thereby a stable single mode oscillation is no longer obtainable. This further causes a rapid reduction of the frequency modulation efficiency in a high modulation frequency range more than approximately 1 GHz. This further more causes a broadening of the spectral linewidth due to a hole burning effect along a cavity length direction of the distributed feedback laser device. To combat the above mentioned problem, it is necessary to suppress the hole burning effect so as to make the distribution of the optical intensity be uniform or flat along the resonance direction or the cavity length direction. It is thus important that the distributed feedback laser with the phase shift grating possesses the uniform or flat distribution of the electronic field of the light to obtain the stable single mode oscillation at the high optical output as well as the flat or uniform frequency modulation properties.

To achieve the above purpose, a corrugation-pitch-modulated distributed feedback laser was proposed and disclosed at the 1991 Conference on Laser and Electro-Optics 654/CPD 40-1. The distributed feedback laser device has a corrugation pitch modulated grating having a larger pitch or a larger period thereof in the center area of about 100 micrometers and a small pitch or a small period outside the center area. The above laser device is able to show a narrow spectral linewidth less than about 100 KHz and an optical output of about 30 mW. The above laser device, however, has a disadvantage in a difficulty in a fabrication of such the corrugation pitch modulated grating. To suppress the hole burning effect, the corrugation pitch modulated grating is required to have a slight difference of angstrom order in the pitches or in the periods thereof between in the center area and the other areas outside the center area. The formation of the corrugation pitch modulated grating requires specific means such as electron beam lithography or ruling engine which provides a difficulty in the fabrication process thereof. The distributed feedback laser with the corrugation pitch modulated grating is, necessarily, engaged with a problem of the difficulty in the fabrication of the corrugation-pitch-modulated grating.

Other type of the distributed feedback laser device with a $\lambda/4$ shift was proposed and disclosed in the 1990 IEEE Photonics Technology Letters, Vol. 2, No. 3, pp. 165–166. The proposed distributed feedback laser device has an n-side electrode formed under a substrate and a p-side electrode formed on the top of the laser device. To control the distribution of the light intensities along the cavity length direction or the resonance direction, the p-side electrode is divided into three sections which forms a line along the cavity length direction or a resonance direction. The distributed feedback laser device having the p-side electrode divided into the three sections shows properties of a spectral linewidth less than about 1 MHz, an optical output of about 20 mW, a frequency modulation range less than 15 GHz and a frequency modulation efficiency of about 600 MHz/mA.

Alternatively, a corrugation-pitch-modulated ditributed feedback laser device having a p-side electrode which is divided into three sections was proposed and disclosed in the Fourth Optoelectronics Conference Technical Digest, July 1992, pp. 58–59. The corrugation-pitch-modulated ditributed feedback laser device has an n-side electrode formed under a substrate and the p-side electrode formed on the top of the laser device. To control the distribution of the light intensities along the cavity length direction or the resonance direction, the p-side electrode is divided into three sections which form a line along the cavity length direction or a resonance direction. The corrugation pitch modulated distributed feedback laser device having the p-side electrode divided into the three sections shows properties of a spectral linewidth less than 100 kHz and a variable wavelength range of 1 nanometer.

The above two types of the distributed feedback laser device with the electrode divided into the three sections, however, have a disadvantage in that it is difficult to control the voltages to be applied to the three sections as the electrode. Any small variation of the biases or voltages applied to the three sections as the p-side electrode unfortunately causes a great variation of oscillating performance of the laser device. To obtain a desirable oscillating performance, it is essential to make a very exact control of the voltages applied to the three sections as the p-side electrode of the laser device. Particularly when the distributed feedback laser device with the multiple sectioned electrode is applied to a high speed system greater than 10 Gb/s, it is necessary to conduct a frequency deviation in the same level as the frequency modulation under a current amplitude sufficient for driving high speed integrated circuits. This requires a much higher frequency modulation efficiency and uniform response to the frequency modulation in a wider range of the modulation wave-lengths. Actually, it is difficult for the conventional distributed feedback laser with the multiple sectioned electrode to satisfy the above requirements.

It has been known as one of methods for improving the efficiency of the frequency modulation to utilize a gain lever effect. The laser device utilizing the gain lever effect which shows a high frequency modulation efficiency of about 20 GHz/mA was proposed and disclosed in 1990, in the Applied Physics Letters Vol. 57 No. 20, pp. 2068–2070. The gain lever effect shows a large change in the carrier density in a gain section of the laser device by a small change in injection current in a control section based on a highly sublinear nature of the gain versus carrier density characteristics of a single quantum well laser device. The gain lever effect may be useful to enhance the frequency modulation efficiency of the laser device without a corresponding increase in the frequency modulation noise and broadening of the spectral linewidth and the like.

The gain lever effect may also appear in a semiconductor laser device with an electrode divided into two or more sections and an active layer whose composition is uniform. The frequency modulation response of tunable two-segment distributed feedback laser device was reported in the 1989 Applied Physics Letters Vol. 55 No. 18, pp. 1826–1828. The electrode are divided into two segments to be applied with injection currents which are asymmetric to each other. The first and second segments as the electrode are applied with a small injection current and a large injection current respectively. In a first area including the first segment applied to the small injection current, a differential gain coefficient is large. In contrast, in a second area including the second segment applied to the large injection current, the differential gain coefficient is small. The above phenomenons are due to that the differential gain coefficient depends upon the carrier density. Namely, a slight modulation of the small injection current to be applied to the first segment causes a large variation of the carrier density in the second area including the second segment applied with the large injection current so as to obtain a high efficiency of the frequency modulation. The above effect may be considered as one kind of the gain lever effects.

The above distributed feedback laser device utilizing the above mentioned gain lever effect with the two segment electrode has however, disadvantages in a long carrier lifetime in the small injection current area of the laser device as well as a reduction of the light intensity. Those makes the frequency modulation range be narrow,

SUMMARY OF THE INVENTION

Accordingly, it is a primary object of the present invention to provide a novel distributed feedback semiconductor laser device completely free from the problems as described above.

It is an object of the present invention to provide a novel distributed feedback semiconductor laser device possessing excellent properties suitable for a coherent optical transmission system.

It is other object of the present invention to provide a novel distributed feedback semiconductor laser device free from any difficulty in fabrication processes thereof.

It is an additional object of the present invention to provide a novel distributed feedback semiconductor laser device which shows a stable single mode oscillation suitable for a coherent optical transmission.

It is a further object of the present invention to provide a novel distributed feedback semiconductor laser device which shows a high optical output performance.

It is a further more object of the present invention to provide a novel distributed feedback semiconductor laser device which shows a narrow spectral linewidth of oscillation.

It is a still further object of the present invention to provide a novel distributed feedback semiconductor laser device which processes a uniform or flat response to frequency modulation over a wide frequency range.

It is yet a further object of the present invention to provide a novel distributed feedback semiconductor laser device which possesses a high efficiency of a frequency modulation.

It is another object of the present invention to provide a novel distributed feedback semiconductor laser device which is possess a flat distribution of light intensity in a resonance direction to prevent a hole burning effect.

It is a still another object of the present invention to provide a novel distributed feedback semiconductor laser device which is able to show a novel gain lever effect which permits a high efficiency of a frequency modulation.

It is yet a another object of the present invention to provide a novel method for fabricating a distributed feedback semiconductor laser device suitable for implementation of the above objects.

The above and other objects, features and advantages of the present invention will be apparent from the following descriptions.

The present invention provides a distributed feedback semiconductor laser device comprising a semiconductor substrate, a bottom electrode formed on a bottom surface of the substrate, a corrugation-shaped grating formed on a top surface of the substrate, an active waveguide layer whose energy band gap profile and propagation constant of light are varied along a cavity length direction of the laser device, and being formed over the corrugation-shaped grating, a clad layer formed to cover the active waveguide layer, and a top electrode formed on a top of the clad layer. The active waveguide layer is grown by a selective metal organic vapor phase epitaxy with use of slender insulation masks having a variation in width and being arranged at both sides of an area on which the active waveguide layer will be grown.

BRIEF DESCRIPTION OF THE DRAWINGS

Preferred embodiments of the present invention will hereinafter fully be described in detail with reference to the accompanying drawings.

DESCRIPTION OF THE PREFERRED EMBODIMENTS

The present invention provides a novel distributed feedback semiconductor laser device showing a stable single mode oscillation and a high optical output performance suitable for the coherent optical transmission. The distributed feedback semiconductor laser device according to the present invention not only shows narrow spectral linewidth of oscillation but also possesses a uniform or flat response to frequency modulation over a wide frequency range as well as a high efficiency of the frequency modulation. The distributed feedback semiconductor laser device according to the present invention further possesses a flat distribution of a light intensity in a resonance direction to prevent a hole burning effect and shows a novel gain lever effect which permits a high efficiency of the frequency modulation.

Figure 1:
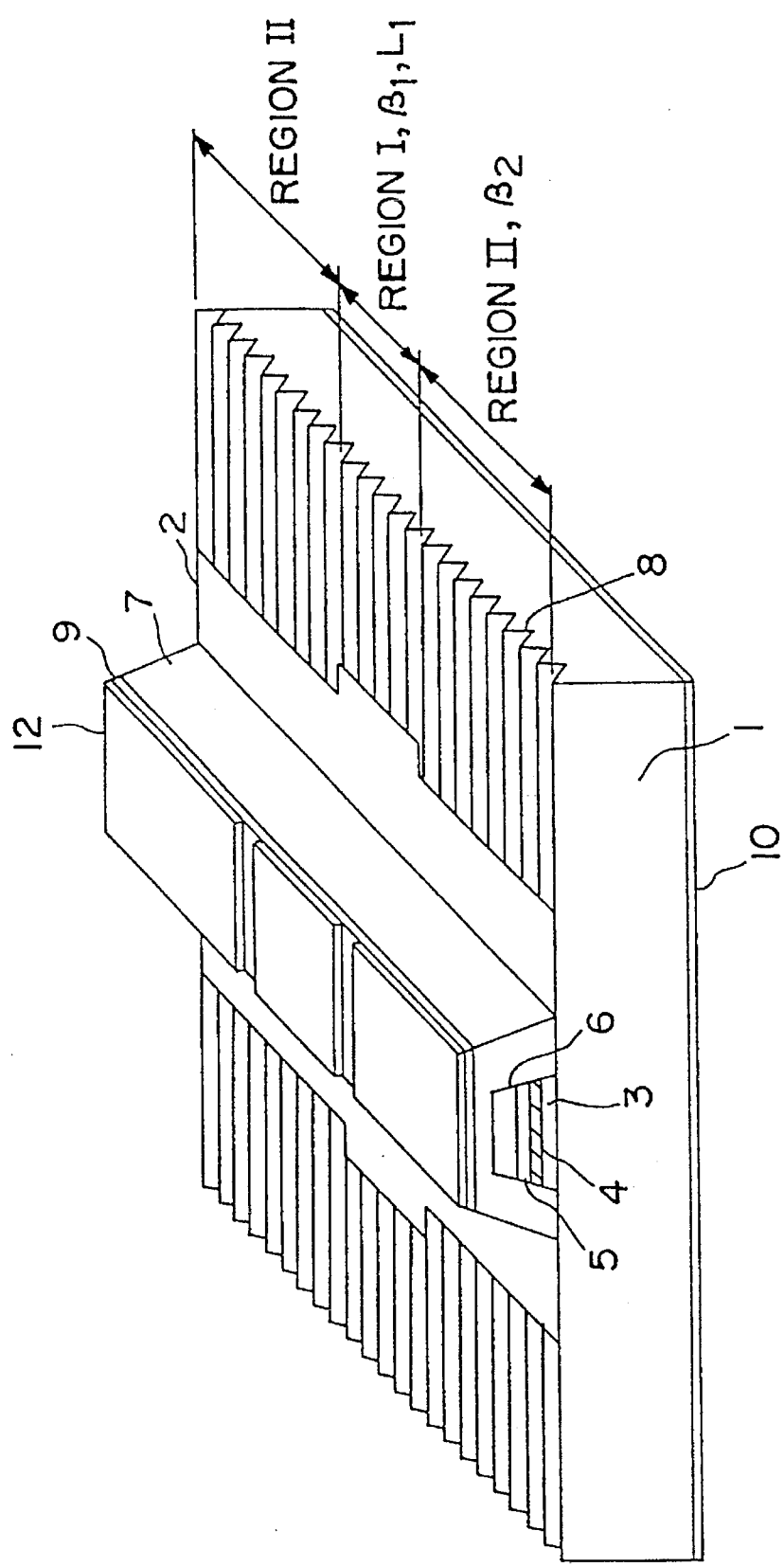
FIG. 1 is a perspective view illustrative a novel distributed feedback semiconductor laser device to describe the basic concept of the present invention.

The basic concept of the present invention will be described with reference to FIG. 1. The distributed feedback semiconductor laser device comprises three sections or a center area I and both side areas II which are arranged along a resonance direction or a cavity length direction. The distributed feedback semiconductor laser device has a constant corrugation pitch grating formed in a top surface of a substrate 1. The constant corrugation pitch grating has a predetermined constant period over the center area I and the both side areas II. The substrate 1 is provided on its entire bottom surface with a first electrode 10. The multiple quantum well active waveguide layer 5 is formed over the substrate 1 along the cavity length direction or the resonance direction. Namely the multiple quantum well active waveguide layer 5 is formed in a rectangle-shaped center area whose longitudinal direction exists along a center axis of the device, which is parallel to the cavity length direction or the resonance direction.

Insulation films 2 are formed on the top surface of the substrate 1 in its two slender areas whose longitudinal direction is parallel to the cavity length direction or the resonance direction. Both of the slender areas are positioned along the opposite sides of the rectangle-shaped center area over which the multiple quantum well active waveguide layer 5 will be formed. Thus, the insulation films 2 have the slender shape in plane view and are formed along the opposite sides of the rectangle-shaped center area on which the multiple quantum well active waveguide layer 5 will be formed. It is however very important for the present invention that each of the slender insulation films 2 has different two widths between in the center area I and the both side areas II. As illustrated in FIG. 1, the slender insulation film 2 in the center area I has a large width than a width thereof in the both side areas II.

The multiple quantum well active waveguide layer 5 is selectively formed by use of a metal organic vapor phase epitaxy on the rectangle-shaped center area sandwiched between the slender insulation films 2 having the large width in the center area I and the small width in the both side areas. Actually, the multiple quantum well active waveguide layer 5 formed by the metal organic vapor phase epitaxy method possesses a different composition and different thickness. The differences in the composition and the thickness of the multiple quantum well active waveguide layer 5 are caused by the variation in the widths of the slender insulation films 2. The compositions and the thicknesses of the multiple quantum well active waveguide layer 5 are varied between in the center area I and in the both side areas II according to the variation of the widths of the slender insulation films 2.

A spacer layer 4 is formed under the multiple quantum well active waveguide layer 5. A guide layer 3 is formed under the spacer layer 4 so as to overlay the top surface of the substrate 1. A first clad layer 6 overlays the multiple quantum well active waveguide layer 5. The laminated layers comprising the first clad layer 6, the multiple quantum well active waveguide layer 5, the space layer 4 and the guide layer 3 are covered with a second clad layer 7 so that the laminated layers 3, 4, 5 and 6 are enclosed with the second clad layer 7 and the top surface of the substrate 1. A contact layer 9 is formed on a top surface of the second clad layer 7. A second electrode 12 is formed on a top surface of the contact layer 9. The laminated layers 3, 4, 5 and 6 and the second clad layer 7 are externally shaped into a rectangle in a plane view and a trapezoid in a cross section perpendicular to the cavity length direction or the resonance direction as illustrated in FIG. 1.

As described above, the multiple quantum well active waveguide layer 5 formed by the metal organic vapor phase epitaxy method possesses differences in composition and thickness between in the center area I and in the both side areas II according to the variation of the widths of the slender insulation films 2. The differences in the composition and the thickness of the multiple quantum well active waveguide layer 5 provide a difference in a propagation constant of a light confined in the waveguide layer 5 between in the center area I and in the both side areas II. The propagation constant depends upon the energy band gap.

The difference in the propagation constant is caused by the difference in the energy band gap. The propagation constant values in the center area I and the both side areas II are expressed by $\beta_1$ and $\beta_2$ respectively and the propagation constant values $\beta_1$ and $\beta_2$ are different from each other. The difference in the propagation constant between in the center area I and the both side areas II causes a phase shift. A difference $\Delta\beta_{12}$ in the propagation constant is defined by the subtraction of the propagation constant $\beta_2$ from the propagation constant $\beta_1$ ($\Delta\beta_{12}=\beta_1-\beta_2$). The magnitude of the phase shift is approximately equal to the product of the difference $\Delta\beta_{12}$ in the propagation constant and a length $L_1$ of the center area I along the resonance direction ($\phi_{sh}=\Delta\beta_{12}\times L_1$). The magnitude of the phase shift is controllable by controlling both the length $L_1$ of the center area I and the difference $\Delta\beta_{12}$ in the propagation constant. The difference $\Delta\beta_{12}$ in the propagation constant depends upon the differences in the compositions and the thicknesses of the waveguide layer 5 between in the center area I and in the both side areas II. The differences in the compositions and the thicknesses of the waveguide layer 5 further depends upon the difference in the widths of the slender insulation films 2 between in the center area I and in the both side areas II. A desirable magnitude of the phase shift is, therefore, readily obtainable by controlling both the length $L_1$ of the center area I and the widths of the slender insulation films 2 in the center area I and the both side areas II. The multiple quantum well active waveguide layer 5 having the different compositions and the different thicknesses exhibits a phase shifting performance like a phase shifter, although the corrugation grating has the constant pitch or constant period. The phase shift effect is caused in the center area I. The length $L_1$ of the center area I may serve as a phase shift area. Since the center area I serving as the phase shift area may be extended about 100 micrometers, the concentration of the light intensity which tends to appear in the phase shift area is relaxed. The relaxation of the concentration of the light intensity is able to suppress an appearance of the hole burning effect thereby resulting in a narrow spectral linewidth and a flat responsibility to the frequency modulation.

The distributed feedback semiconductor laser device according to the present invention has a further advantage in a facility in the fabrication by use of the conventional fabrication techniques of the photolithography and a single metal organic vapor phase epitaxy growth.

Figure 2A:
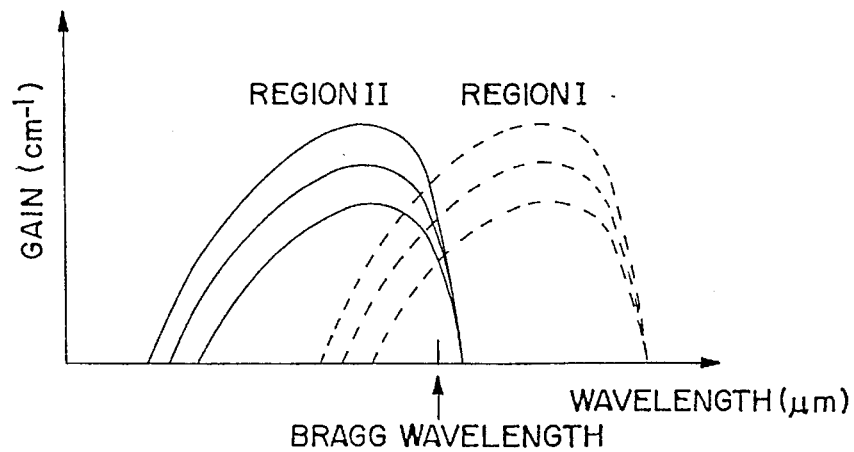
FIG. 2A is a diagram illustrative of optical gain versus wavelength characteristics due to novel gain lever effects of a novel distributed feedback semiconductor laser device according to the present invention.

The distributed feedback semiconductor laser device according to the present invention also exhibits a new gain lever effect as described below. The gain lever effect improves the efficiency of the frequency modulation. The differential gain coefficient of the semiconductor laser device is variable according to an amount of the injection carrier and the oscillation wavelength. As described above, the waveguide layer 5 fabricated by the selective metal organic vapor phase epitaxy method has differences in the composition and the thickness between in the center area I and in the both side areas II. A gain versus wavelength characteristic is variable dependent upon the composition and the thickness of the waveguide layer 5 and further the carrier density. The increase in carrier density labeled by the arrow mark in FIG. 2A provides a larger gain. The distribution of the gain over wavelength is different between in the center area I serving as the phase shift area and the both side areas II as shown in FIG. 2A. The distribution of the gain appearing in the center area I serving as the phase shift area exists over larger wavelengths as compared to the distribution of the gain in the both side areas II. The Bragg wavelength labeled by the arrow mark in FIG. 2A is the oscillation wavelength at which the laser device should show the laser beam oscillation. The oscillation wavelength or the Bragg wavelength is approximately defined by the pitch or the period of the constant corrugation pitch grating formed on the top surface of the substrate. The constant corrugation pitch or the period of the grating is designed so that the Bragg wavelength exists between the distributions of the gains appearing in both the center area I and both of the side areas II as shown in FIG. 2A. The desired Bragg wavelength may readily be obtainable by controlling the pitch of the corrugation grating. When the Bragg wavelength exists at the center of the two gain distributions in the center area I and both of the side areas II, the differential gains are different between in the center area I and both of the side areas II as shown in FIG. 2B.

Figure 2B:
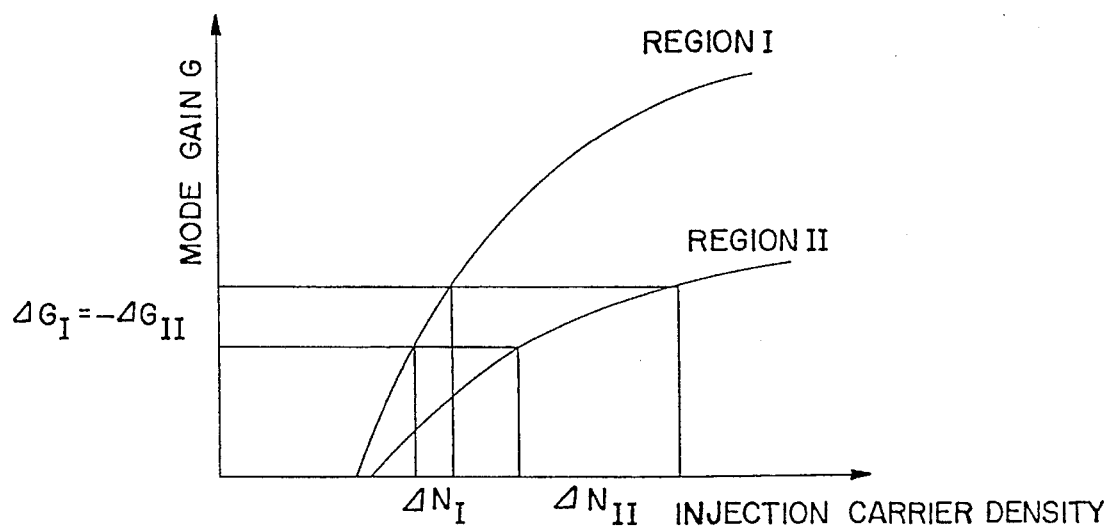
FIG. 2B is a diagram illustrative of optical gain versus injected carrier density characteristics due to novel gain lever effects of a novel distributed feedback semiconductor laser device according to the present invention.

FIG. 2B illustrates a mode gain versus carrier density characteristic of the semiconductor laser according to the present invention. With respect to the oscillation modes of the semiconductor laser device, a total mode gain G is necessarily equal to a total loss thereof. When the total mode gain is varied by a current modulation, a differential coefficient G of the total mode gain is always zero. As described above, the distributed feedback semiconductor layer device has the active waveguide layer 5 which possesses a difference in the differential gains between in the center area I serving as the phase shift area and in both of the side areas II. Referring back to FIG. 2A, the increases of the carrier densities in the center area I and both of the side areas II are expressed by the arrow marks. From that, in the center area I serving as the phase shift area, a small increase of the carrier density causes a large increase of the gain. In contrast, in both of the side areas, a small increase of the carrier density causes a small increase of the gain. The differential gain in the center area I is larger than that in both of the side areas II as shown in FIG. 2B. The center area I serving as the phase shift area has a high differential gain rather than that in both of the side areas II.

When the carrier density of the waveguide layer 5 in the center area I is increased by $\Delta N_I$, the mode gain is also increased by $\Delta G_I$ as shown in FIG. 2A. The increase of the mode gain by $\Delta G_I$ in the center area I causes a decrease of the mode gain by $-\Delta G_{II}$ in both of the side areas II so that the differential total mode gain $\Delta G_I-\Delta G_{II}$ is zero. Since both side areas II have a small differential gain, the decrease of the mode gain $-\Delta G_{II}$ in both of the side areas II causes a relatively large decrease $-\Delta N_{II}$ of the carrier density in both of the side areas II. It is thus understood that the small variation of the carrier density of the active waveguide layer 5 in the center area I serving as the phase shift area provides the large variation of the carrier density of the active waveguide layer 5 in both of the side areas II. The large variation of the carrier density of the active waveguide layer 5 in both of the side areas II further causes a large variation of a refractive index of the light. The large variation of the refractive index causes a large variation of the frequency of the oscillation light. A small modulation of the injection current in the center area I is bale to provide a large frequency variation in both of the side areas II. Form the above descriptions, it is readily appreciated that the modulation of the injection current in the active waveguide layer in the center area I is able to provide a high efficiency of the frequency modulation. The distributed feedback semiconductor laser device according to the present invention is able to show the new gain lever effect as described above. Even when the active waveguide layer both in the center area I and in both of the side areas II has the same high carrier density by the uniform current injection through a single segment of the electrode, the differential gain is produced thereby resulting in a high efficiency of the frequency modulation, a wide frequency modulation range and a narrow spectral linewidth.

The distributed feedback semiconductor laser device according to the present invention has the advantage in facility in the fabrication process therefor and shows excellent properties or high performances. The concentration of the light intensity in the center area I serving as the phase shift area is relaxed to thereby suppress the hole burning effect This results in the flat or uniform response to the frequency modulation and the narrow spectral linewidth. The new gain lever effect provide high efficiency of frequency modulation and wide frequency modulation range.

A first embodiment of the present invention will be described with reference to FIGS. 3A to 3B and 4. The description will be directed to fabrication processes for a novel distributed feedback layer semiconductor device with a multiple quantum well active waveguide layer of the first embodiment according to the present invention.

Figure 3A:
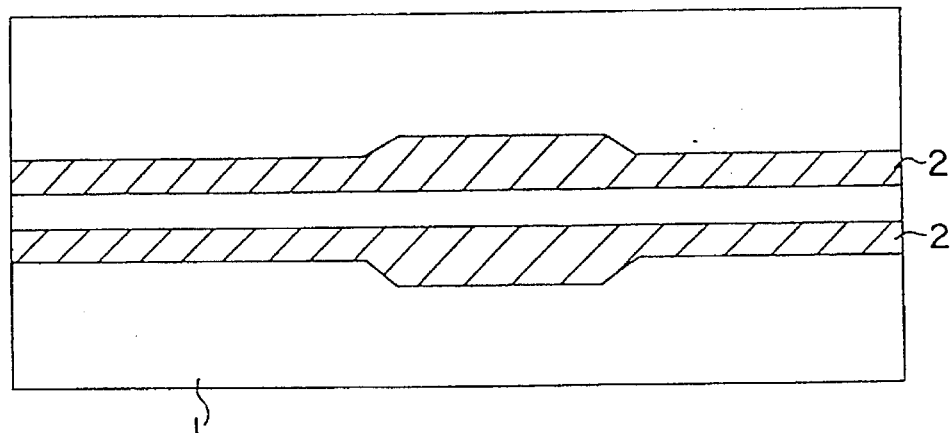
FIG. 3A is a plane view illustrative of a step involved in a novel method of fabricating a distributed feedback semiconductor laser device of a first embodiment according to the present invention.

FIG. 3A is a plane view of a substrate 1 for a novel semiconductor laser device of the first embodiment according to the present invention. The substrate 1 is an n-InP semiconductor substrate with a surface of an orientation (100). A top surface of the substrate 1 is formed with a corrugation shaped grating 8 which has a predetermined constant pitch or period. As described above, the pitch or the period of the corrugation shaped grating 8 defines the oscillation wavelength or the Bragg wavelength. The corrugation shaped grating has a pitch or period of about 2400 angstroms so that the oscillation wavelength defined by the pitch of the corrugation shaped grating 8 exists between the gain peak oscillation wavelengths in the center area I serving as the phase shift area and both of the side areas II as shown in FIG. 2A. The entire top surface of the substrate 1 including the constant corrugation pitch grating 8 is subjected to chemical vapor deposition so that a silicon oxide film (SiO$_2$ film) having a thickness of about 2000 angstroms is deposited on the entire top surface of the substrate 1. The deposited silicon oxide film is subjected to a patterning to serve as silicon oxide masks 2 as illustrated in FIG. 3A. The silicon oxide mask 2 has a slender shape and comprise a wide center portion of 12 micrometers in width and of 50 micrometers in length and narrow portions of 6 micrometers. The total length of the slender silicon oxide mask is 900 micrometers. The two slender silicon oxide masks 2 are arranged to be separated at a distance of 2 micrometers and in parallel to each other along a cavity length direction or a resonance direction. The two slender silicon oxide masks 2 defines and sandwiches a rectangle shaped center area Whose longitudinal direction is along the cavity length direction or the resonance direction.

Figure 3B:
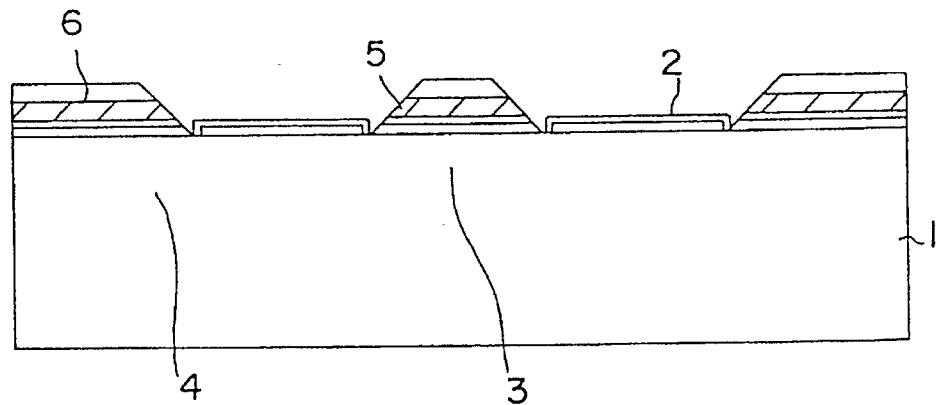
FIGS. 3B to 3C are fragmentary cross sectional elevation views illustrative of sequential steps involved in a novel method of fabricating a distributed feedback semiconductor laser device of a first embodiment according to the present invention.

As shown in FIG. 3B, a GaInAsP guide layer 3 having a thickness of 1500 angstroms is formed by a selective metal organic vapor phase epitaxy method using the silicon oxide masks 2. The guide layer 3 has a composition for an oscillation wavelength of 1.15 micrometers. A non-doped InP spacer layer 4 having a thickness of 500 angstroms is formed by the selective metal organic vapor phase epitaxy method using the silicon oxide film masks 2 on a top surface of the guide layer 3. A multiple quantum well active waveguide layer 5 is formed by the selective metal organic vapor phase epitaxy method using the silicon oxide film masks 2 on a top surface of the spacer layer 4. The multiple quantum well active waveguide layer 5 has at its both ends guide layers. A p-InP clad layer 6 having a thickness of 3000 angstroms is formed by the selective metal organic vapor phase epitaxy method using the silicon oxide film masks 2 on a top surface of the multiple quantum well active waveguide layer 5. A depth of the grating after growing the above layers is about 250 angstroms. A coupling coefficient is about 30 cm$^{-1}$. The multiple quantum well active waveguide layer 5 comprises an InGaAs well layer, barrier layers sandwiching the well layer and guide layers sandwiching the barrier layers. The well has a thickness of 70 angstroms. The barrier layer has an InGaAsP composition of an oscillation wavelength of 1.15 micrometer and has a thickness of 100 angstroms. The guide layer has an InGaAsP composition of an oscillation wavelength of 1.15 micrometer and has a thickness of 1500 angstroms.

Figure 3C:
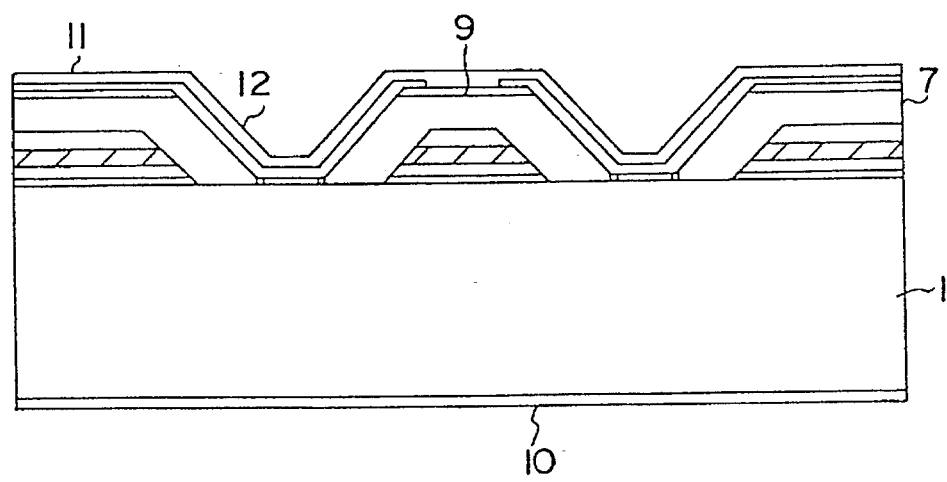

As shown in FIG. 3C, the slender silicon oxide masks 2 are subjected to etching so that inner and outer side areas of the silicon oxide masks 2 are removed. p-InP clad layers 7 of 2 micrometers in thickness and 6 micrometers in width are formed by the selective metal organic vapor phase epitaxy method using the remaining silicon oxide film masks 2 so as to cover the above laminated layers 3, 4, 5 and 6. A p-GaInAs contact layer 9 of 0.5 micrometers in thickness is formed on a top surface of the p-InP clad layer 7.

As a result, the difference in the propagation constant between in the center area and the both side areas provides a $\lambda/4$ phase shift. The center phase shift area makes the concentration of the light intensity be relaxed thereby suppressing a hole burning effect.

A silicon oxide film (SiO$_2$ film) 11 is formed on an entire surface of the laser device. A part of the silicon oxide film 11 on the contact layer 9 is removed so that the contact layer 9 is exposed. An electrode 12 is formed on an entire surface of the laser device so that a part of the electrode 12 is contacted with the exposed surface of the contact layer 9. An electrode 10 is provided on a bottom surface of the substrate 1 thereby the desirable distributed feedback semiconductor laser device is fabricated.

The multiple quantum well active waveguide layer 5 grown by the selective metal organic vapor phase epitaxy using the silicon oxide mask of 5 and 10 micrometers in width has a difference of about 50 nanometers in multiple quantum well wavelength. It is presumed that the differential gain in the center area is four times of that in the both side areas thereby providing a large gain lever effect. According to the above, it may be presume that the difference in the propagation constant between in the center area and in both of the side areas is about 200 cm$^{-1}$ and the length L$_1$ of 50 micrometers of the center area is preferable to obtain the $\lambda/4$ shift. The length L$_1$ of 50 micrometers of the center area further is able to provide a 50% improvement in the uniformity of the light intensity in the cavity.

Figure 4:
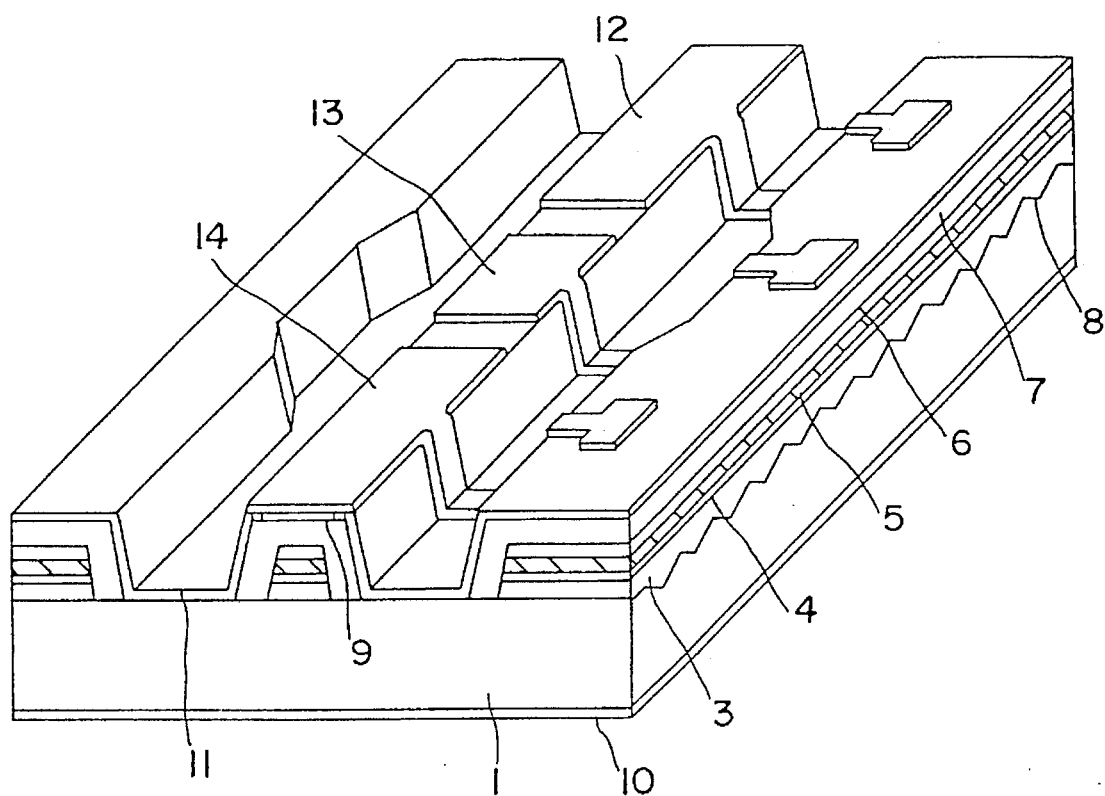
FIG. 4 is a fragmentary cross sectional elevation view illustrative of a novel distributed feedback semiconductor laser device of a first embodiment according to the present invention.

FIG. 4 illustrates a perspective view of the fabricated distributed feedback semiconductor laser device of the first embodiment according to the present invention. The top electrode is divided into three sections 12, 13 and 14 which are separated from each other. The section 13 of the top electrode is positioned in the center area in which the active waveguide layer 5 shows a large differential gain and thus the center area is able to serve as a phase shift area.

It was confirmed that the distributed feedback semiconductor laser device of the first embodiment according to the present invention exhibits a narrow spectral linewidth less than 1 MHz under a condition of a high optical output of 30 mW. The response to frequency modulation of the laser device is measured under a condition of the modulation of the injection current. It was confirmed that the laser device shows excellent properties in a very high frequency modulation efficiency of 1 GHz/mA and a wide frequency modulation range of 5 GHz.

Although in the first embodiment the amount of the phase shift produced by the difference in the propagation constant of the active waveguide layer 5 is λ/4, the amount of the phase shift is variable. As a modification of the above, the distributed feedback laser device with a 3 λ/8 phase shift confirmed that the laser device with the 3 λ/8 phase shift shows a very large frequency modulation efficiency of about 1.5 MHz/mA. As further modifications of the above, the distributed feedback laser device with a phase shift in the range of from 0.25 λ to 0.40 λ confirmed that the laser device with the above phase shift shows a very large frequency modulation efficiency in the range of from 1 GHz/mA to 2 GHz/mA.

Various modifications of the laser device of the first embodiment according to the present invention may be available. For example, the top electrode of the laser device may be a single segment electrode. The silicon oxide film 2 may be shaped to have a narrower width in the center area I as the phase shift area. Further, a combination of the above two modifications is available.

Figure 5:
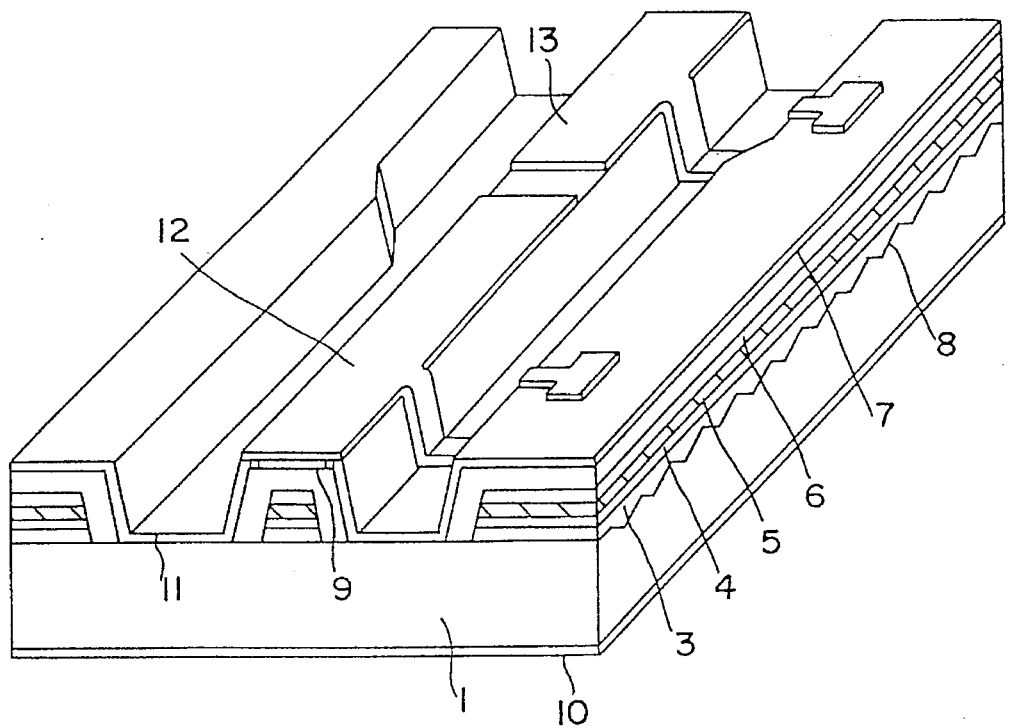
FIG. 5 is a fragmentary cross sectional elevation view illustrative of a novel distributed feedback semiconductor laser device of a second embodiment according to the present invention.

FIG. 5 is a perspective view illustrative of a novel distributed feedback semiconductor laser device of a second embodiment according to the present invention. The difference in the structure between the semiconductor laser devices of the first and second embodiments is in a position of the phase shift area and the top electrode.

The substrate 1 is the n-InP semiconductor substrate with a surface of an orientation (100). The top surface of the substrate 1 is formed with the corrugation shaped grating 8 which has a predetermined constant pitch or period of about 2400 angstroms so that the oscillation wavelength defined by the pitch of the corrugation shaped grating 8 exists between the gain peak oscillation wavelengths in the phase shift area and the other area. The entire top surface of the substrate 1 including the constant corrugation pitch grating 8 is subjected to the chemical vapor deposition so that the silicon oxide film ($SiO_2$ film) of about 2000 angstroms in thickness is deposited on the entire top surface of the substrate 1. The deposited silicon oxide film is subjected to a patterning to serve as silicon oxide masks not illustrated. The silicon oxide mask has a slender shape and comprise a wide portion of 12 micrometers in width and of 50 micrometers in length and a narrow portion of 6 micrometers. The total length of the slender silicon oxide mask is 900 micrometers. The two slender silicon oxide masks are arranged to be separated at a distance of 2 micrometers and in parallel to each other along a cavity length direction or a resonance direction. The two slender silicon oxide masks defines and sandwiches a rectangle shaped center area whose longitudinal direction is along the cavity length direction or the resonance direction. The GaInAsP guide layer 3 having a thickness of 1500 angstroms is formed by a selective metal organic vapor phase epitaxy method using the silicon oxide masks. The guide layer 3 has a composition for an oscillation wavelength of 1.15 micrometers. The non-doped InP spacer layer 4 having a thickness of 500 angstroms is formed by the selective metal organic vapor phase epitaxy method using the silicon oxide film masks on a top surface of the guide layer 3. The multiple quantum well active waveguide layer 5 is formed by the selective metal organic vapor phase epitaxy method using the silicon oxide film masks 2 on a top surface of the spacer layer 4. The p-InP clad layer 6 having a thickness of 3000 angstroms is formed by the selective metal organic vapor phase epitaxy method using the silicon oxide film masks on a top surface of the multiple quantum well active waveguide layer 5. A depth of the grating after growing the above layers is about 250 angstroms. A coupling coefficient is about 30 $cm^{-1}$. The multiple quantum weal active waveguide layer 5 comprises the InGaAs well layer, the barrier layers sandwiching the well layer and the guide layers sandwiching the barrier layers. The well layer has a thickness of 70 angstroms. The barrier layer has an InGaAsP composition of an oscillation wavelength of 1.15 micrometer and has a thickness of 100 angstroms. The guide layer has an InGaAsP composition of an oscillation wavelength of 1.15 micrometer and has a thickness of 1500 angstroms.

Subsequently, the slender silicon oxide masks 2 are subjected to etching so that inner and outer side areas of the silicon oxide masks are removed. The p-InP clad layers 7 of 2 micrometers in thickness and 6 micrometers in width are formed by the selective metal organic vapor phase epitaxy method using the remaining silicon oxide film masks so as to cover the above laminated layers 3, 4, 5 and 6. A p-GaInAs contact layer 9 of 0.5 micrometers in thickness is formed on a top surface of the p-InP clad layer 7. The silicon oxide film 11 is formed on the entire surface of the laser device. A part of the silicon oxide film 11 on the contact layer 9 is removed so that the contact layer 9 is exposed. The top electrodes of two segments 12 and 13 are formed over the contact layer 9. The bottom electrode 10 is provided on a bottom surface of the substrate 1 to thereby fabricate the desirable distributed feedback semiconductor laser device according to the present invention.

It was confirmed that the distributed feedback semiconductor laser device of the second embodiment according to the present invention shows almost the same excellent properties as that of the first embodiment. The gain lever effect appears directly. The two segment top electrodes 12 and 13 may be biased at the high carrier density so that the frequency modulation is performed in the phase shift area showing the high differential gain on which the segment 13 are formed thereby resulting in a high frequency modulation efficiency.

Figure 6:
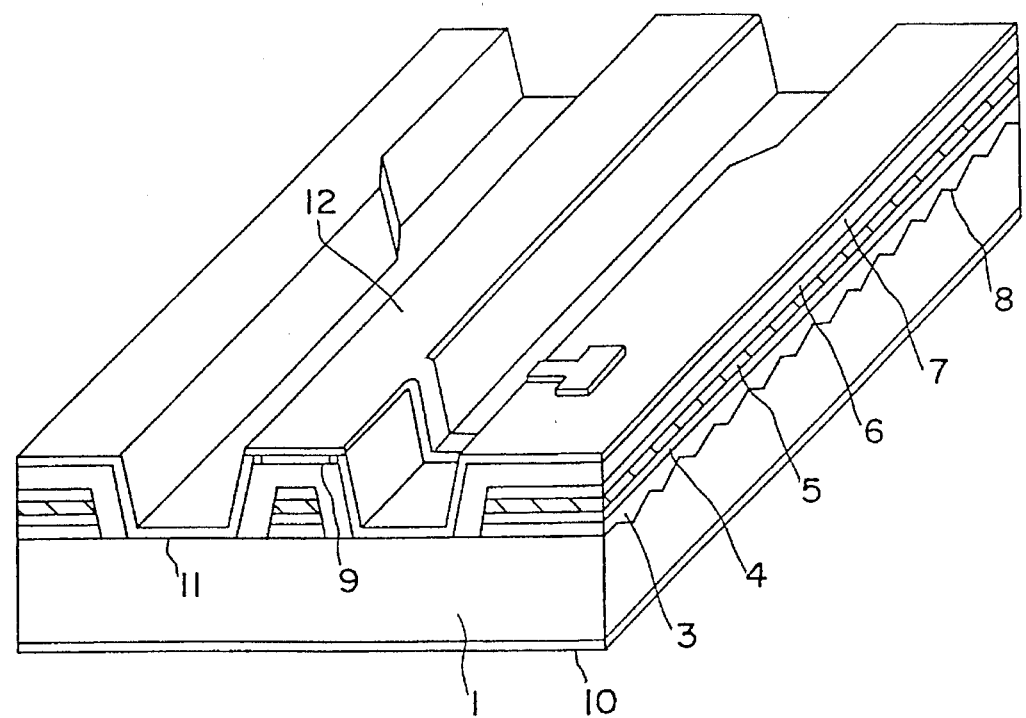
FIG. 6 is a fragmentary cross sectional elevation view illustrative of a novel distributed feedback semiconductor laser device of a third embodiment according to the present invention.

The description will be directed to a third embodiment according to the present invention with reference to FIG. 6. The difference in the structure between the semiconductor laser devices of the second and third embodiments is in the top electrode.

The substrate 1 is the n-InP semiconductor substrate. The top surface of the substrate 1 is formed with the corrugation shaped grating 8 which has a predetermined constant pitch or period of about 2400 angstroms. The entire top surface of the substrate 1 is subjected to chemical vapor deposition so that the silicon oxide film of about 2000 angstroms in thickness is deposited on the entire top surface of the substrate 1. The deposited silicon oxide film is subjected to a patterning to serve as silicon oxide masks not illustrated. The silicon oxide mask has a slender shape and comprise a wide portion of 12 micrometers in width and a narrow portion of 6 micrometers. The total length of the slender silicon oxide mask is 900 micrometers. The two slender silicon oxide masks are arranged to be separated at a distance of 2 micrometers and in parallel to each other along a cavity length direction or a resonance direction. The two slender silicon oxide masks defines and sandwiches a rectangle shaped center area whose longitudinal direction is along the cavity length direction or the resonance direction. The GaInAsP guide layer 3 having a thickness of 1500 angstroms is formed by the selective metal organic vapor phase epitaxy method using the silicon oxide masks. The guide layer 3 has a composition for an oscillation wavelength of 1.15 micrometers. The non-doped InP spacer layer 4 having a thickness of 500 angstroms is formed by the selective metal organic vapor phase epitaxy method on a top surface of the guide layer 3. The multiple quantum well active waveguide layer 5 is formed by the selective metal organic vapor phase epitaxy method on a top surface of the spacer layer 4. The p-InP clad layer 6 having a thickness of 3000 angstroms is formed by the selective metal organic vapor phase epitaxy method on a top surface of the multiple quantum well active waveguide layer 5. The multiple quantum well active waveguide layer 5 comprises the InGaAs well layer, the barrier layers sandwiching the well layer and the guide layers sandwiching the barrier layers. The well has a thickness of 70 angstroms. The barrier layer has an InGaAsP composition of an oscillation wavelength of 1.15 micrometer and has a thickness of 100 angstroms. The guide layer has an InGaAsP composition of an oscillation wavelength of 1.15 micrometer and has a thickness of 1500 angstroms.

Subsequently, the slender silicon oxide masks 2 are subjected to etching so that inner and outer side areas of the silicon oxide masks are removed. The p-InP clad layers 7 of 2 micrometers in thickness and 6 micrometers in width are formed by the selective metal organic vapor phase epitaxy method. The p-GaInAs contact layer 9 of 0.5 micrometers in thickness is formed on a top surface of the p-InP clad layer 7. The silicon oxide film 11 is formed on the entire surface of the laser device except on the contact layer 9. The top electrode of a single segments 12 is formed over the contact layer 9. The bottom electrode 10 is provided on a bottom surface of the substrate 1 thereby the desirable distributed feedback semiconductor laser device is fabricated.

It was confirmed that the distributed feedback semiconductor laser device of the second embodiment according to the present invention shows almost the same excellent properties as those of the first and second embodiments. The single segment top electrode 12 may be biased at the high carrier density.

Although in the above embodiments the InP substrate is selected to obtain the laser device having an oscillation wavelength in the range of from 1.2 to 1.6 micrometers, other materials such as GaInAs system are available.

Modification of the invention herein disclosed will occur to a person skilled in the art and all such modifications are deemed to be within the scope of this invention as defined by the appended claims.

What is claimed is:

1. A method of fabricating a distributed feedback semiconductor laser device comprising the steps of:

forming a corrugation-shaped grating formed on a top surface of a substrate;

forming two slender insulation masks having a variation in width on said top surface of said substrate, said two slender insulation masks being arranged in parallel to each other and separated by a distance, said two slender insulation masks each having a center area about 50 micrometers in length;

growing an active waveguide layer by use of a selective metal organic vapor phase epitaxy method using said two slender insulation masks so that said active waveguide layer grown has an energy band gap profile and a light propagation constant that are varied along a cavity length direction of said laser device;

forming a clad layer so as to cover said active waveguide layer; and providing a top electrode formed on a top of said clad layer and a bottom electrode on a bottom surface of said substrate.

2. A method of fabricating a distributed feedback semiconductor laser device as claimed in claim 1, wherein each of said slender insulation masks comprises a wide portion in said center area and narrow portions in both side portions.

3. A method of fabricating a distributed feedback semiconductor laser device as claimed in claim 1, wherein each of said slender insulation film comprises a wide portion in one end area and a narrow portion in an opposite end area.

4. A method of fabricating a distributed feedback semiconductor laser device as claimed in claim 1, wherein each of said slender insulation film comprises a narrow portion in said center area and wide portions in both side areas.

5. A method of fabricating a distributed feedback semiconductor laser device as claimed in claim 2, wherein said top electrode comprises three segments electrically separated from each other and respectively arranged in said center area and said both side areas.

6. A method of fabricating a distributed feedback semiconductor laser device as claimed in claim 2, wherein said top electrode comprises a single segment.

7. A method of fabricating a distributed feedback semiconductor laser device as claimed in claim 3, wherein said top electrode comprises two segments electrically separated from each other and arranged in said one end area and said opposite end are respectively.

8. A method of fabricating a distributed feedback semiconductor laser device as claimed in claim 3, wherein said top electrode comprises a single segment.

9. A method of fabricating a distributed feedback semiconductor laser device as claimed in claim 1, wherein said corrugation-shaped grating has a constant period.

10. A method of fabricating a distributed feedback semiconductor laser device as claimed in claim 1, wherein said active waveguide layer comprises a multiple quantum well layer.

* * * * *